(12) United States Patent
Chen et al.

(10) Patent No.: US 10,476,481 B2
(45) Date of Patent: Nov. 12, 2019

(54) ACOUSTIC FILTERING CIRCUITRY INCLUDING CAPACITOR

(71) Applicant: Qorvo US, Inc., Greensboro, NC (US)

(72) Inventors: Alan S. Chen, Windermere, FL (US); Kurt G. Steiner, Orlando, FL (US); Benjamin P. Abbott, Longwood, FL (US); Taeho Kook, Orlando, FL (US); Scott Shive, Ocoee, FL (US); Jean Briot, Hillsboro, OR (US)

(73) Assignee: Qorvo US, Inc., Greensboro, NC (US)

( * ) Notice: Subject to any disclaimer, the term of this patent is extended or adjusted under 35 U.S.C. 154(b) by 150 days.

(21) Appl. No.: 15/670,066

(22) Filed: Aug. 7, 2017

(65) Prior Publication Data
US 2018/0041193 A1    Feb. 8, 2018

Related U.S. Application Data

(60) Provisional application No. 62/371,893, filed on Aug. 8, 2016.

(51) Int. Cl.
H03H 9/64 (2006.01)
H03H 9/02 (2006.01)
H03H 3/08 (2006.01)

(52) U.S. Cl.
CPC .......... H03H 9/6483 (2013.01); H03H 3/08 (2013.01); H03H 9/02535 (2013.01);
(Continued)

(58) Field of Classification Search
CPC .. H03H 3/08; H03H 9/02535; H03H 9/02559; H03H 9/02992; H03H 9/6423; H03H 9/6483; H03H 9/6489
(Continued)

(56) References Cited

U.S. PATENT DOCUMENTS 5,125,136 A *  6/1992  Cho ............. H03H 3/08
                                      148/DIG. 6
6,404,303 B1 * 6/2002  Kuroda ......... H03H 9/0542
                                      333/193
(Continued)

FOREIGN PATENT DOCUMENTS

JP         11-041055 A  *  2/1999

OTHER PUBLICATIONS

English language machine translation of JP 11-041055 A, published Feb. 12, 1999, 3 pages. (Year: 1999).*

(Continued)

*Primary Examiner* — Barbara Summons
(74) *Attorney, Agent, or Firm* — Withrow & Terranova, P.L.L.C.

(57) ABSTRACT

Acoustic filtering circuitry includes a piezoelectric layer, a dielectric layer, a plurality of acoustic resonators, and a capacitor. The dielectric layer is over a surface of the piezoelectric layer. The plurality of acoustic resonators each includes a transducer on the surface of the piezoelectric layer such that the transducer is between the piezoelectric layer and the dielectric layer. The capacitor includes a first plate on the surface of the piezoelectric layer such that the first plate is between the piezoelectric layer and the dielectric layer and a second plate over the first plate such that the second plate and the first plate are separated by at least a portion of the dielectric layer.

20 Claims, 16 Drawing Sheets

(52) U.S. Cl.
CPC ...... *H03H 9/02992* (2013.01); *H03H 9/6423* (2013.01); *H03H 9/6489* (2013.01)

(58) Field of Classification Search
USPC .................. 333/193–196; 310/313 B, 313 D
See application file for complete search history.

(56) References Cited

U.S. PATENT DOCUMENTS

| | | | | |
|---|---|---|---|---|
| 8,013,692 | B2* | 9/2011 | Haruta | H03H 9/059 310/313 B |
| 8,482,363 | B2* | 7/2013 | Fujiwara | H03H 9/0071 333/133 |
| 9,136,458 | B2* | 9/2015 | Komatsu | H03H 9/02818 |
| 2005/0142851 | A1* | 6/2005 | Kim | H01L 23/5223 438/624 |
| 2007/0158848 | A1* | 7/2007 | Matsumoto | H01G 4/008 257/758 |
| 2009/0109035 | A1* | 4/2009 | Subramanian | G08B 13/242 340/572.8 |
| 2015/0349748 | A1* | 12/2015 | Bauer | H03H 9/542 333/133 |
| 2016/0141107 | A1* | 5/2016 | You | H03H 3/08 333/193 |

OTHER PUBLICATIONS

Babcock, J.A., et al., "Analog Characteristics of Metal-Insulator-Metal Capacitors Using PECVD Nitride Dielectrics," IEEE Electron Device Letters, vol. 22, No. 5, May 2001, pp. 230-232.

Gaillard, N., et al., "In situ Electric Field Simulation in Metal/Insulator/Metal Capacitors," Applied Physics Letters, vol. 89, No. 13, Available online Sep. 26, 2006, 3 pages.

Kar-Roy, A., et al., "High Density Metal Insulator Metal Capacitors Using PECVD Nitride for Mixed Signal and RF Circuits," IEEE International Conference on Interconnect Technology, May 24-26, 1999, San Francisco, California, 3 pages.

Kim, S.-J., et al., "Metal-Insulator-Metal RF Bypass Capacitor Using Niobium Oxide (Nb2O5) with HfO2/Al2O3 Barriers," IEEE Electron Device Letters, vol. 26, No. 9, Sep. 2005, pp. 625-627.

Schrenk, M., et al., "Integration of Metal Insulator Metal Capacitors (MIM-Caps) with Low Defectivity into a Copper Metallization," Microelectronic Engineering, vol. 82, Available online Aug. 24, 2005, pp. 514-520.

* cited by examiner

ACOUSTIC FILTERING CIRCUITRY INCLUDING CAPACITOR

RELATED APPLICATIONS

This application claims the benefit of provisional patent application Ser. No. 62/371,893, filed Aug. 8, 2016, the disclosure of which is hereby incorporated herein by reference in its entirety.

FIELD OF THE DISCLOSURE

The present disclosure relates to acoustic filtering circuitry such as filtering circuitry including surface acoustic wave (SAW) resonators and bulk acoustic wave (BAW) resonators. In particular, the present disclosure relates to acoustic filtering circuitry including one or more capacitors that are integral with the acoustic wave devices therein.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. For purposes of illustration, FIG. 1 shows details of a conventional SAW resonator 10. The conventional SAW resonator 10 includes a piezoelectric layer 12, an interdigital transducer 14 on a surface of the piezoelectric layer 12, a first reflector structure 16A on the surface of the piezoelectric layer 12 adjacent to the interdigital transducer 14, and a second reflector structure 16B on the surface of the piezoelectric layer 12 adjacent to the interdigital transducer 14 opposite the first reflector structure 16A.

The interdigital transducer 14 includes a first interdigital electrode 18A and a second interdigital electrode 18B, each of which include a number of fingers 20 that are interleaved with one another as shown. A distance between adjacent fingers 20 of the first interdigital electrode 18A and the second interdigital electrode 18B defines an electrode period P of the interdigital transducer 14. A ratio between the cross-sectional area along the surface of the piezoelectric layer 12 occupied by the adjacent fingers 20 and the empty space between the adjacent fingers 20 defines a metallization ratio M of the interdigital transducer 14. The electrode period P and the metallization ratio M together characterize the interdigital transducer 12 and may determine one or more operational parameters of the conventional SAW resonator 10. For example, the electrode period P and the metallization ratio M of the interdigital transducer 14, along with other factors such as the properties of the piezoelectric layer 12 may determine a resonant response of the device.

In operation, an alternating electrical input signal provided at the first interdigital electrode 18A is transduced into a mechanical signal in the piezoelectric layer 12, resulting in one or more acoustic waves therein. In the case of the conventional SAW device 10, the resulting acoustic waves are predominately surface acoustic waves. As discussed above, due to the electrode period P and the metallization ratio M of the interdigital transducer 14, the characteristics of the material of the piezoelectric layer 12, and other factors, the magnitude and frequency of the acoustic waves transduced in the piezoelectric layer 12 are dependent on the frequency of the alternating electrical input signal. This frequency dependence is often described in terms of changes in the impedance and/or a phase shift between the first interdigital electrode 18A and the second interdigital electrode 18B with respect to the frequency of the alternating electrical input signal. The acoustic waves transduced by the alternating electrical input signal travel in the piezoelectric layer 12, eventually reaching the second interdigital electrode 18B where they are transduced into an alternating electrical output signal. The first reflector structure 16A and the second reflector structure 16B reflect the acoustic waves in the piezoelectric layer 12 back towards the interdigital electrode 14 to confine the acoustic waves in the area surrounding the interdigital transducer 14.

FIG. 2 is a graph illustrating an ideal relationship of the impedance (shown as admittance) and phase shift between the first interdigital electrode 18A and the second interdigital electrode 18B to the frequency of the alternating electrical input signal for the conventional SAW resonator 10. A solid line 22 illustrates the admittance between the first interdigital electrode 18A and the second interdigital electrode 18B with respect to the frequency of the alternating electrical input signal. Notably, the solid line 22 includes a peak at a first point P1 at which the admittance between the first interdigital electrode 18A and the second interdigital electrode 18B climbs rapidly to a maximum value. This peak occurs at the series resonant frequency ($f_S$) of the conventional SAW resonator 10. The impedance between the first interdigital electrode 18A and the second interdigital electrode 18B at the series resonant frequency is minimal, such that the first interdigital electrode 18A and the second interdigital electrode 18B appear as a short-circuit. The solid line 22 also includes a valley at a second point P2 at which the admittance between the first interdigital electrode 18A and the second interdigital electrode 18B plummets rapidly to a minimum value. This valley occurs at the parallel resonant frequency ($f_P$) of the conventional SAW resonator 10. The impedance between the first interdigital electrode 18A and the second interdigital electrode 18B at the parallel resonant frequency is at a maximum, such that the first interdigital electrode 18A and the second interdigital electrode 18B appear as an open circuit.

A dashed line 24 illustrates the phase shift between the first interdigital electrode 18A and the second interdigital electrode 18B with respect to the frequency of the alternating electrical input signal. Notably, the dashed line shows that a 90° phase shift occurs between the series resonant frequency and the parallel resonant frequency. This phase shift is due to the change in the impedance from primarily capacitive to primarily inductive between the series resonant frequency and the parallel resonant frequency.

While the series resonant frequency and the parallel resonant frequency of the conventional SAW resonator 10 are shown occurring at certain frequencies in the graph, various aspects of the conventional SAW resonator 10, such as the electrode period P and the metallization ratio M of the interdigital transducer 14, the material of the piezoelectric layer 12, and other factors may be modified to raise or lower both the series resonant frequency and the parallel resonant frequency. However, the frequency of the conventional SAW resonator 10 is generally limited due to limits in the velocity of acoustic waves in the piezoelectric layer 12. This in turn limits the utility of the conventional SAW resonator 10, precluding its use in applications requiring processing of high frequency signals above a certain threshold. Further, there are limits in the frequency delta achievable between SAW devices such as the conventional SAW resonator 10 fabricated on the same wafer, such that multi-frequency SAW devices generally must be on different wafers that consume more space in a device.

The graph shown in FIG. 2 is highly idealized. In reality, the response of the conventional SAW resonator 10 includes spurious areas that degrade the performance thereof. Further, the response of the conventional SAW resonator 10 may be temperature dependent, which may be undesirable in many circumstances. There have been numerous developments in the technology in an effort to suppress these spurious responses and temperature compensate devices; however, there is a need for further improvements in these areas.

The conventional SAW resonator 10 may be used along with one or more additional resonators to construct conventional acoustic filtering circuitry 26, as illustrated in FIG. 3. The conventional acoustic filtering circuitry 26 includes a number of resonators R1-R9 coupled in a ladder network as shown. In particular, a first resonator R1, a second resonator R2, a third resonator R3, and a fourth resonator R4 are coupled in series between an input node 28 and an output node 30 to provide a series path. A fifth resonator R5, a sixth resonator R6, a seventh resonator R7, an eighth resonator R8, and a ninth resonator R9 are coupled in shunt between various points of the series path and a ground node 32. The resonant frequencies of each one of the resonators R1-R9 are generally slightly different from one another and designed to provide a desired filter response between the input node 28 and the output node 30. For example, the resonators R1-R9 may provide a bandpass filter response, a bandstop filter response, or a notch filter response between the input node 28 and the output node 30.

Each one of the resonators R1-R9 may be collocated on the same acoustic die. In some cases, it may be desirable to match an impedance at the input node 28 and the output node 30 to external circuitry coupled thereto. This has previously been accomplished with capacitors external to the acoustic die on which the resonators R1-R9 are located. More recently, capacitors coupled directly to the input node 28 and the output node 30 for impedance matching purposes have been provided on the same acoustic die as the resonators R1-R9 by providing an additional interdigital transducer on the die. As will be appreciated by those skilled in the art, an interdigital transducer will provide a capacitance between the separate interdigitated electrodes thereof. These additional interdigital transducers provided for impedance matching are designed to resonate away from the acoustic response of the resonators R1-R9 such that the acoustic response thereof contributes minimally to the filter response between the input node 28 and the output node 30. Accordingly, the primary purpose of these additional interdigital transducers is for impedance matching, and not to change a filter response of the conventional acoustic filtering circuitry 26.

The external capacitors and/or additional interdigital transducers used to provide impedance matching at the input node 28 and the output node 30 of the conventional acoustic filtering circuitry 26 take up a large area. Due to the continual demand for smaller components for modern electronic devices, there is a need for improved ways for providing impedance matching in acoustic filtering circuitry. Further, the external capacitors and/or additional interdigital transducers can only be provided directly coupled to the input node 28 or the output node 30 of the conventional acoustic filtering circuitry 26. That is, external capacitors and/or additional interdigital transducers generally cannot be provided in the interior of the ladder network such that at least one of the resonators R1-R9 is located between the external capacitor and/or additional interdigital transducer, the input node 28, and the output node 30. This may limit the ability of the conventional acoustic filtering circuitry 26 to achieve certain filter responses and/or limit the quality of the filter response thereof.

In light of the above, there is a need for improved acoustic filtering circuitry, and specifically for improved ways for integrating capacitors with acoustic filtering circuitry.

SUMMARY

In one embodiment, acoustic filtering circuitry includes a piezoelectric layer, a dielectric layer, a plurality of acoustic resonators, and a capacitor. The dielectric layer is over a surface of the piezoelectric layer. The plurality of acoustic resonators each includes a transducer on the surface of the piezoelectric layer such that the transducer is between the piezoelectric layer and the dielectric layer. The capacitor includes a first plate on the surface of the piezoelectric layer such that the first plate is between the piezoelectric layer and the dielectric layer and a second plate over the first plate such that the second plate and the first plate are separated by at least a portion of the dielectric layer. By using the dielectric layer to separate the first plate and the second plate, the size of the capacitor may be significantly reduced. Further, since the first plate and the second plate are formed from the same layer as the transducers for the plurality of acoustic resonators and one or more waveguides for the resonators, respectively, the capacitor may be provided without adding any layers above those required for the resonators.

In one embodiment, a method includes providing a piezoelectric layer, providing a first metal layer on a surface of the piezoelectric layer, patterning the first metal layer to provide a plurality of transducers and a first plate, providing a dielectric layer over the surface of the piezoelectric layer and the first metal layer, providing a second metal layer on a surface of the dielectric layer opposite the piezoelectric layer, and patterning the second metal layer to provide a waveguide over each of the transducers and a second plate over the first plate such that the second plate and the first plate are separated by at least a portion of the dielectric layer to form a capacitor. By providing the first capacitor using layers already used for the transducers and the waveguides, the first capacitor may be integrated into the acoustic filtering circuitry without any additional layers. Further, because the capacitor is vertically disposed using the dielectric layer to separate the first plate and the second plate, the size of the capacitor may be significantly reduced.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
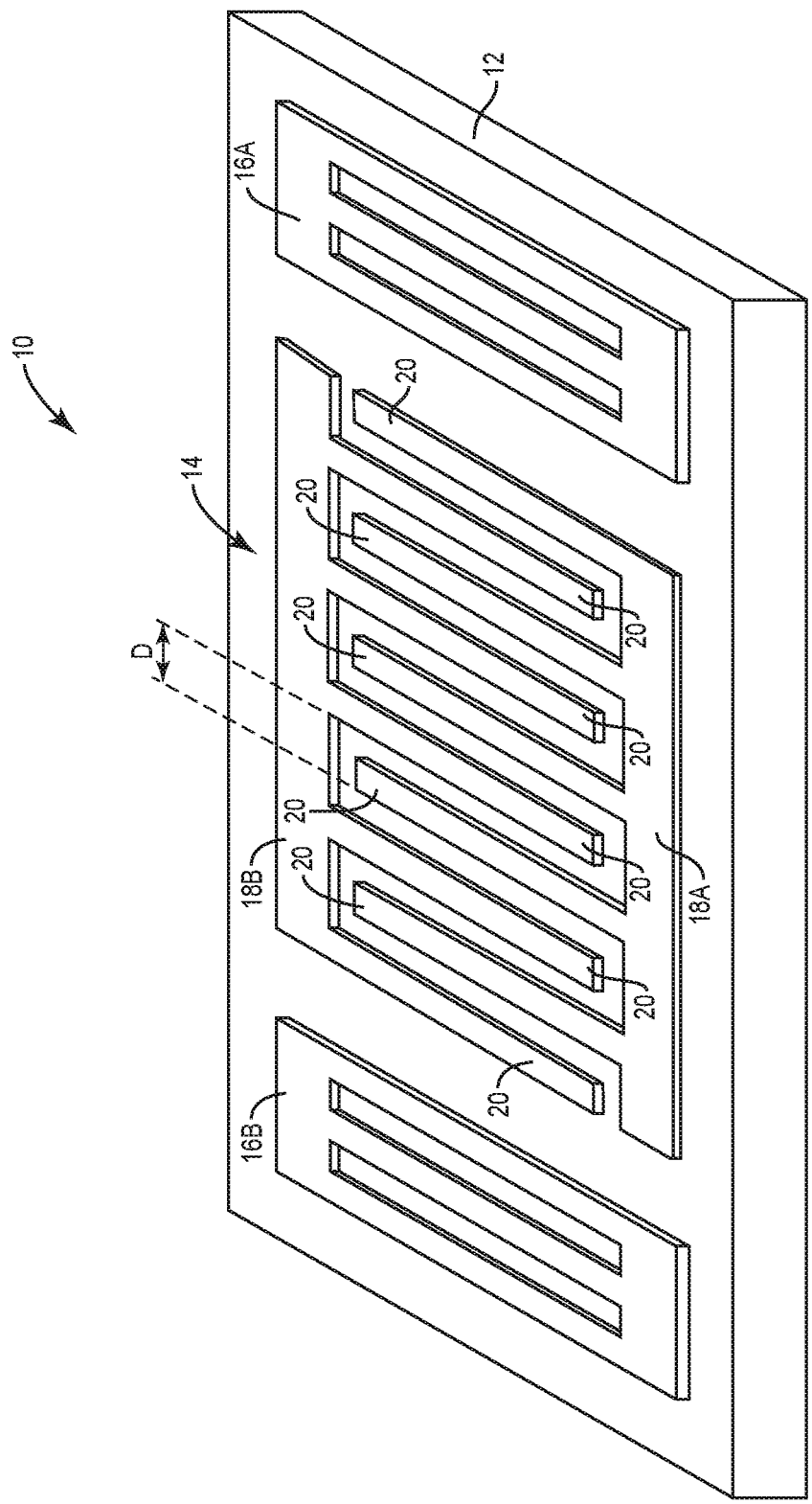
FIG. 1 shows a conventional surface acoustic wave (SAW) resonator.
Figure 2:
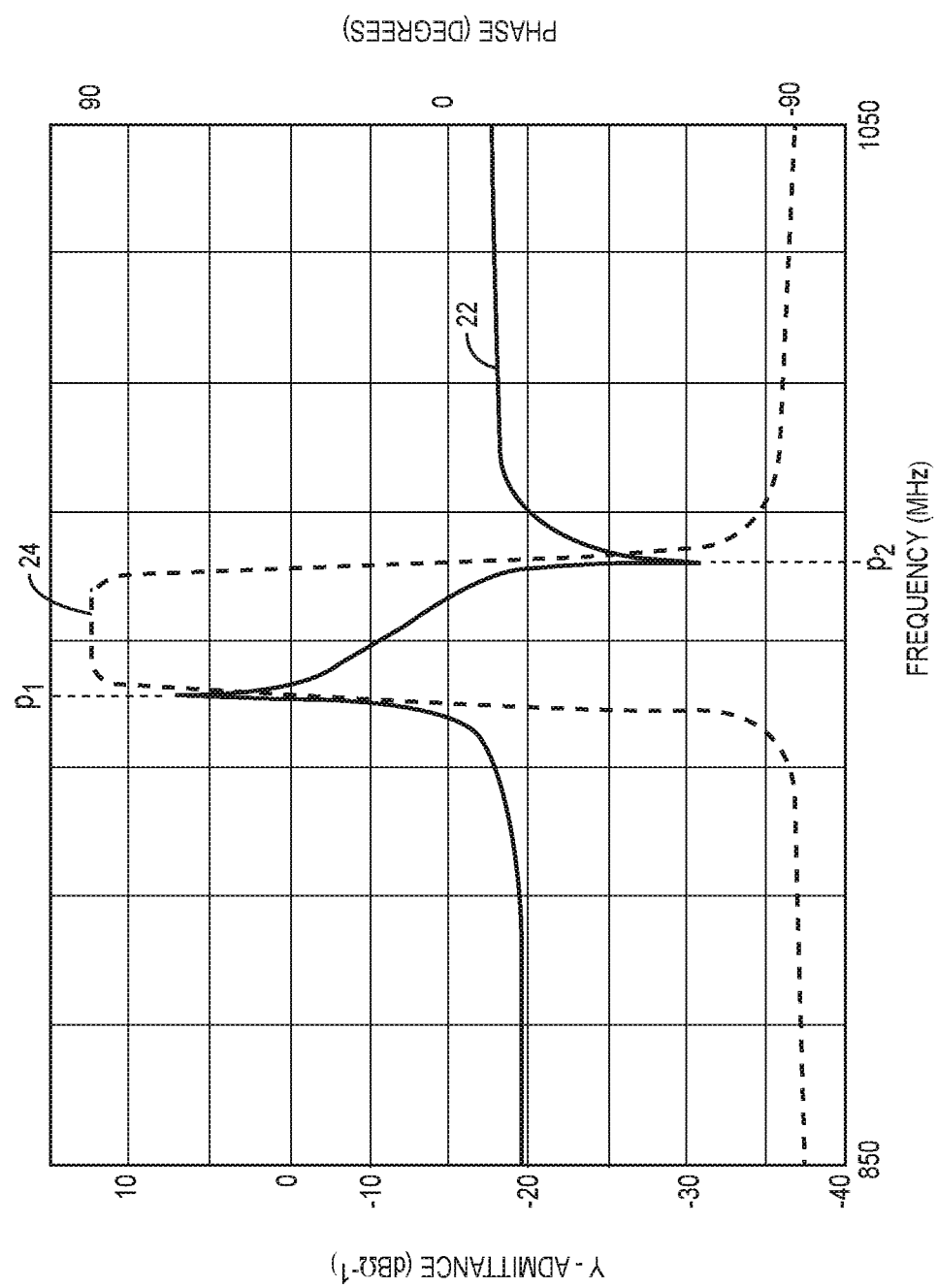
FIG. 2 is a graph illustrating a response of a conventional SAW resonator.
Figure 3:
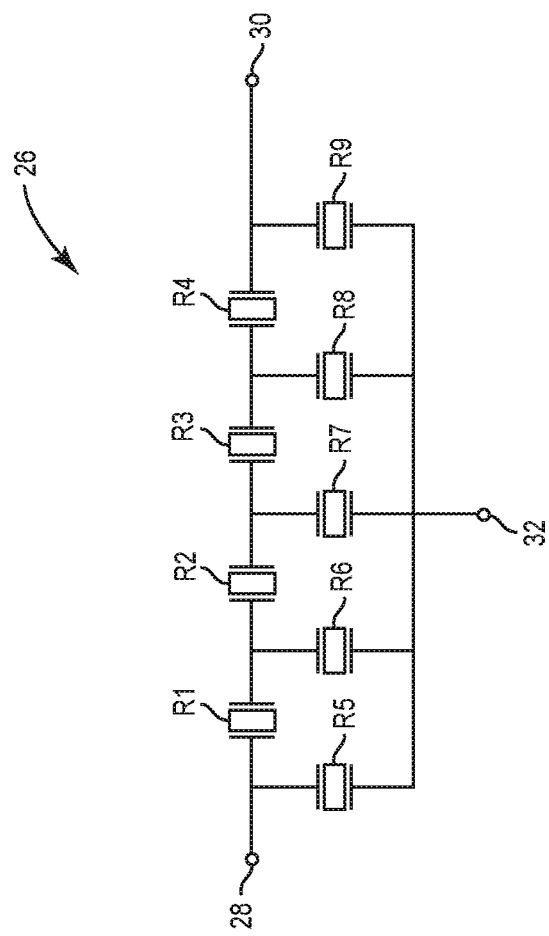
FIG. 3 is a schematic illustrating conventional acoustic filtering circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 4A:
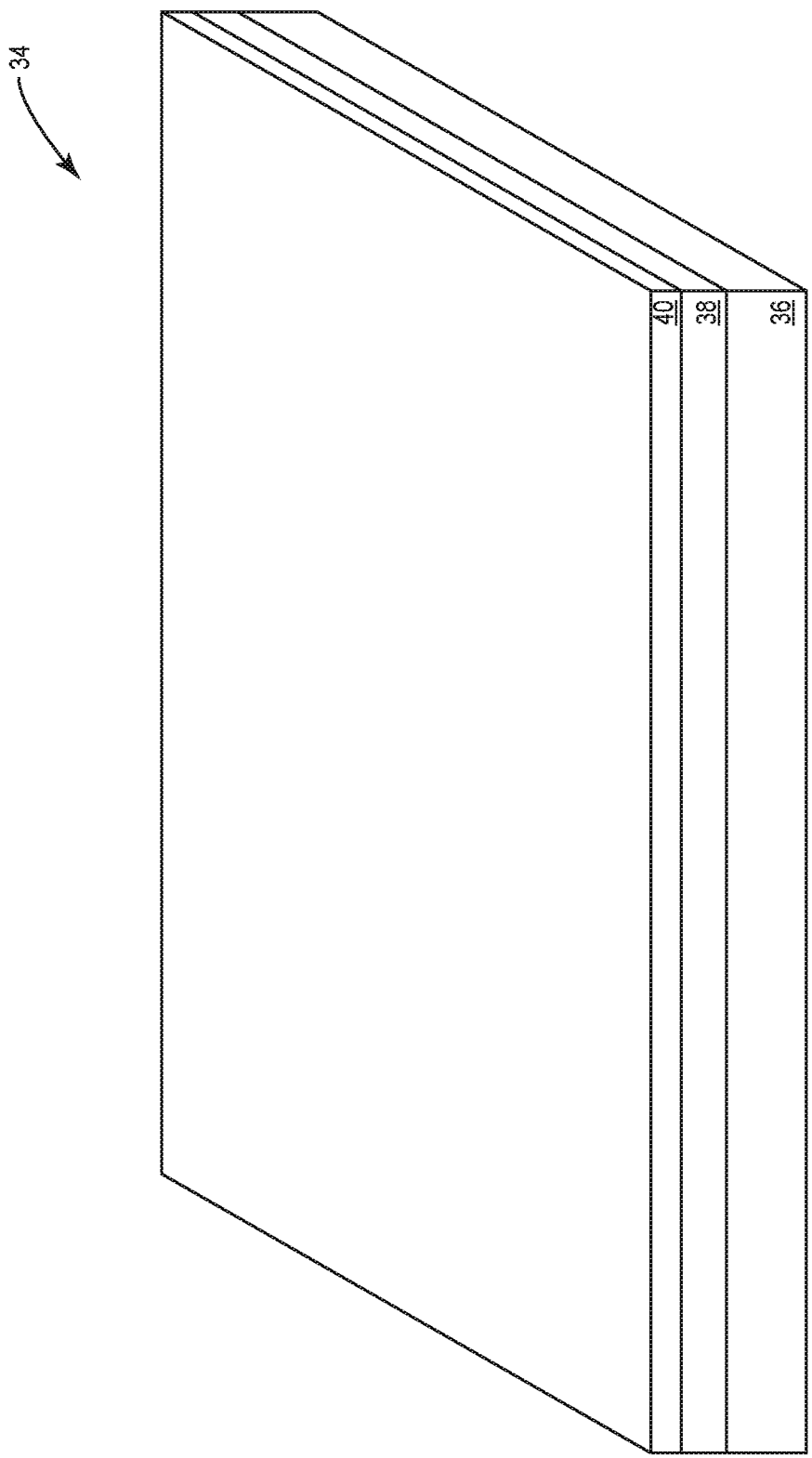
FIGS. 4A-4C show a temperature compensated acoustic resonator according to one embodiment of the present disclosure.
Figure 4B:
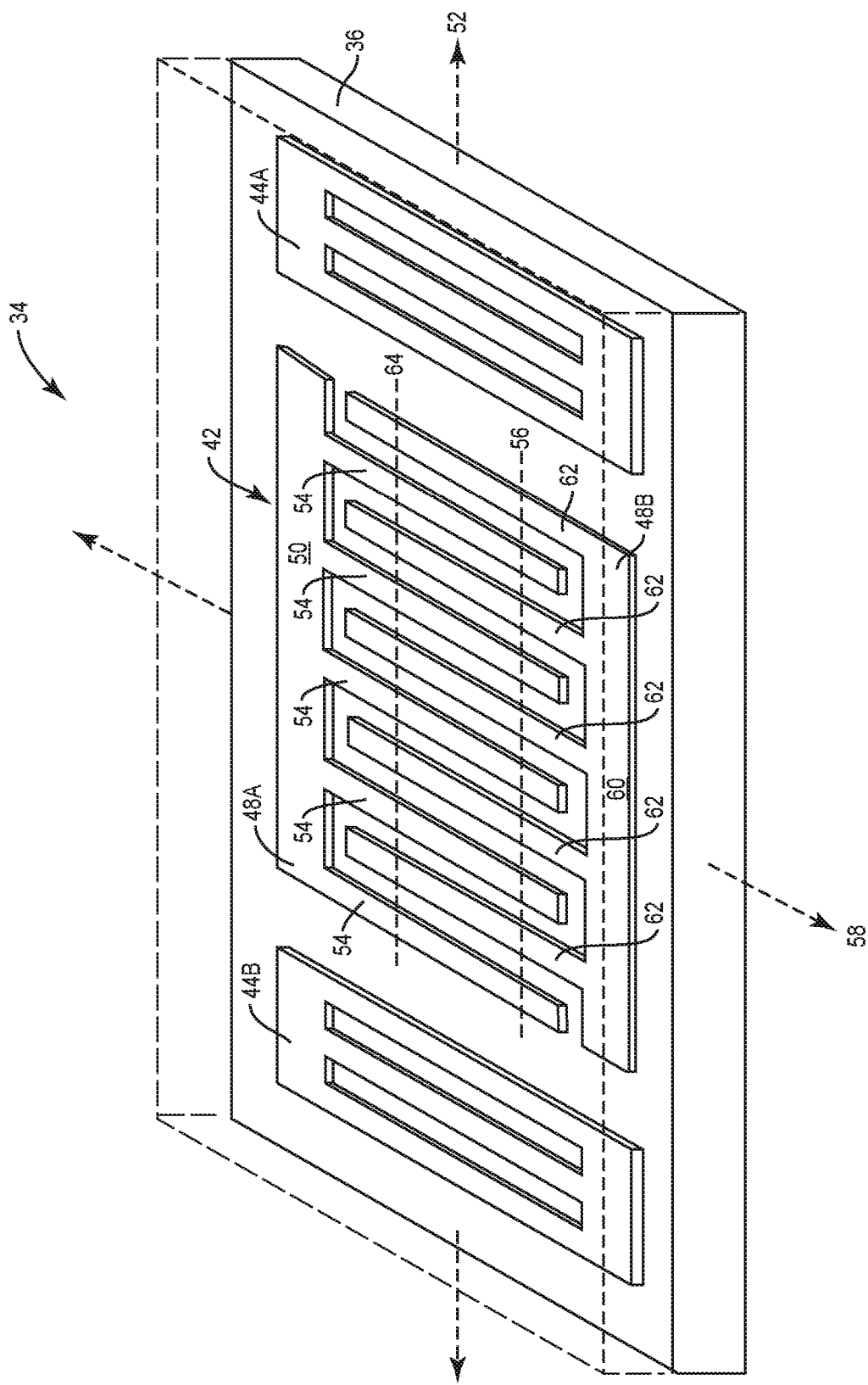
Figure 4C:
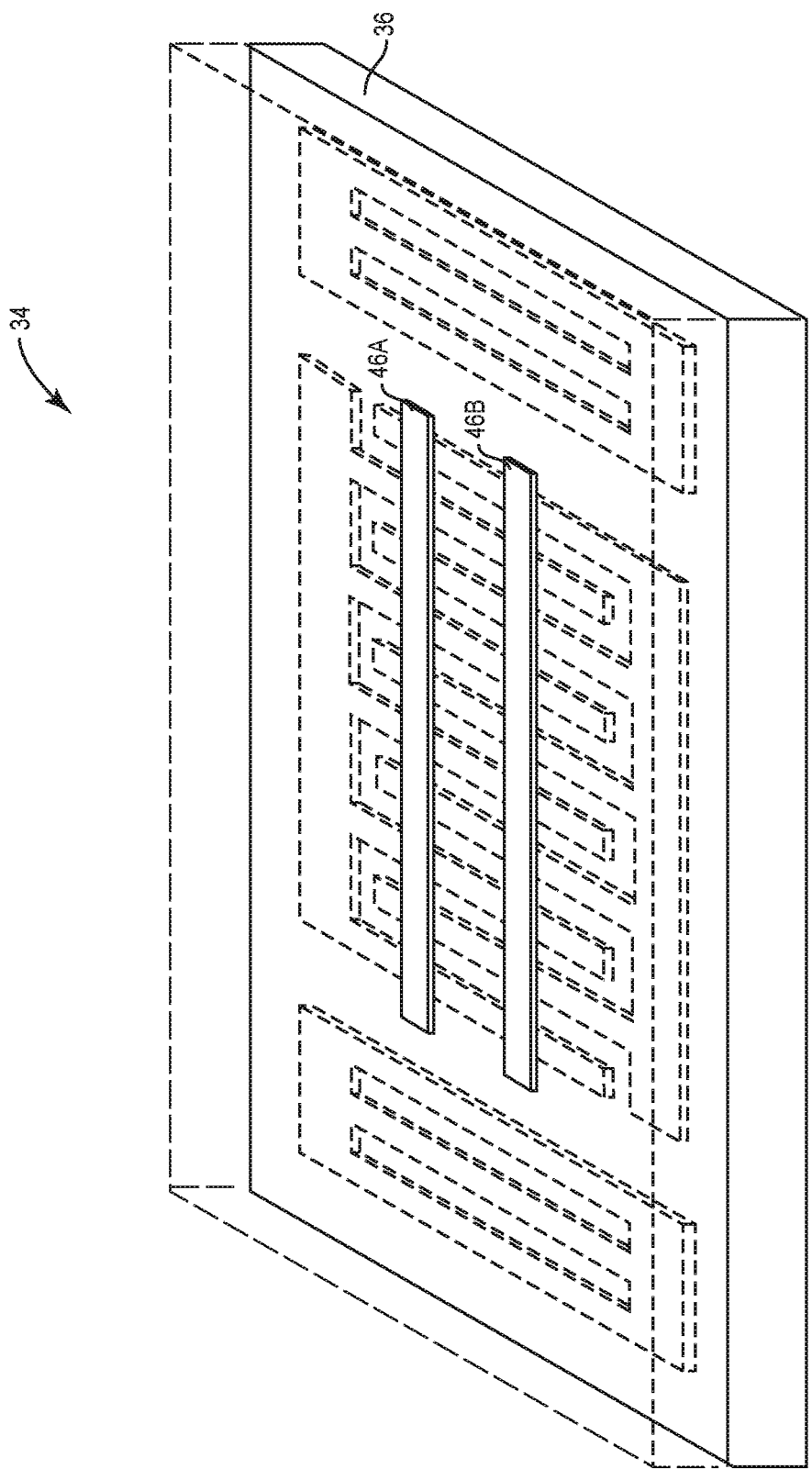

FIGS. 4A through 4C show details of a temperature compensated acoustic resonator 34 according to one embodiment of the present disclosure. The temperature compensated acoustic resonator 34 includes a piezoelectric layer 36, a dielectric layer 38 over a surface of the piezoelectric layer 36, and a frequency tuning layer 40 over a surface of the dielectric layer 38 opposite the piezoelectric layer 36. Under the dielectric layer 38 and the frequency tuning layer 40, the temperature compensated acoustic resonator 34 includes an interdigital transducer 42 on the surface of the piezoelectric layer 36, a first reflector structure 44A on the surface of the piezoelectric layer 36 adjacent to the interdigital transducer 42, a second reflector structure 44B on the surface of the piezoelectric layer 36 adjacent to the interdigital transducer 42 opposite the first reflector structure 44A, and a number of waveguides 46 suspended over certain parts of the interdigital transducer 42 in the dielectric layer 38.

The interdigital transducer 42 includes a first interdigital electrode 48A and a second interdigital electrode 48B. The first interdigital electrode 48A includes a first bus bar 50 arranged parallel to a longitudinal axis 52 of the temperature compensated acoustic resonator 34 and a first set of electrode fingers 54, each of which extends transversely from the first bus bar 50 to a first electrode termination edge 56, which is also parallel to the longitudinal axis 52. In other words, each one of the first set of electrode fingers 54 extends parallel to a lateral axis 58 of the temperature compensated acoustic resonator 34, which is perpendicular to the longitudinal axis 52, between the first bus bar 50 and the first electrode termination edge 56. The second interdigital electrode 48B includes a second bus bar 60 arranged parallel to the longitudinal axis 52 and a second set of electrode fingers 62, each of which extends transversely from the second bus bar 60 to a second electrode termination edge 64, which is also parallel to the longitudinal axis 52. In other words, each one of the second set of electrode fingers 62 extends parallel to the lateral axis 58 between the second bus bar 60 and the second electrode termination edge 64.

A distance between adjacent ones of the first set of electrode fingers 54 and the second set of electrode fingers 62 define an electrode period P of the interdigital transducer 42. A ratio between the cross-sectional area along the surface of the piezoelectric layer 36 occupied by the adjacent ones of the first set of electrode fingers 54 and the second set of electrode fingers 62 and the empty space between the adjacent ones of the first set of electrode fingers 54 and the second set of electrode fingers 62 defines a metallization ratio M of the interdigital transducer 42. The electrode period P and the metallization ratio M together characterize the interdigital transducer 42 and may determine one or more operational parameters of the temperature compensated acoustic resonator 34. In the present embodiment, the interdigital transducer 42 is configured to primarily transduce a piston wave in the piezoelectric layer 36, as discussed in detail below.

In operation, an alternating electrical input signal provided at the first interdigital electrode 48A is transduced into a mechanical signal in the piezoelectric layer 36, resulting in one or more acoustic waves, which are desirably piston waves, therein. As discussed above, due to the electrode period P and the metallization ratio M of the interdigital transducer 42, the characteristics of the material of the piezoelectric layer 36, and other factors, the magnitude and frequency of the acoustic waves transduced in the piezoelectric layer 36 are dependent on the frequency of the alternating electrical input signal. This frequency dependence is often described in terms of changes in the impedance and/or a phase shift between the first interdigital electrode 48A and the second interdigital electrode 48B with respect to the frequency of the alternating electrical input signal. The acoustic waves transduced by the alternating electrical input signal travel in the piezoelectric layer 36, eventually reaching the second interdigital electrode 48B where they are transduced into an alternating electrical output signal. The first reflector structure 44A and the second reflector structure 44B reflect the acoustic waves in the piezoelectric layer 36 back towards the interdigital transducer 42 to confine the acoustic waves in the area surrounding the interdigital transducer 42.

Figure 5:
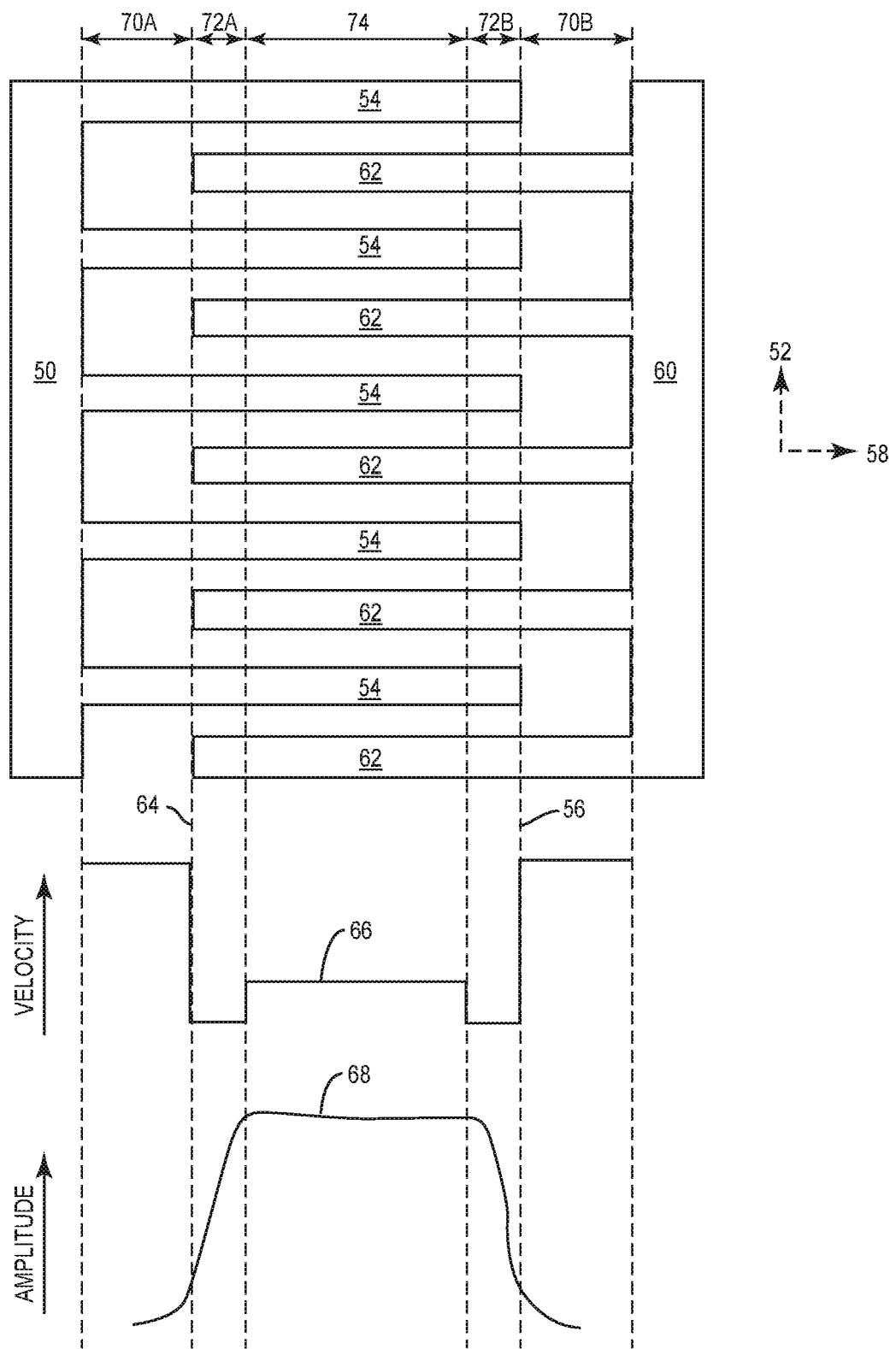
FIG. 5 shows a top view of a temperature compensated acoustic resonator according to one embodiment of the present disclosure.

FIG. 5 shows a top view of the interdigital transducer 42 according to one embodiment of the present disclosure. Notably, the interdigital transducer 42 is designed to primarily transduce a piston wave in the piezoelectric layer 36, which is illustrated by a wave amplitude plot 66 at the bottom of FIG. 5. A velocity plot 68 illustrates a desired wave velocity in each one of a number of regions defined by the interdigital transducer 42. In particular, a first fast wave propagation region 70A is defined as the area between the first bus bar 50 and the second electrode termination edge 64, a second fast wave propagation region 70B is defined as the area between the second bus bar 60 and the first electrode termination edge 56, a first slow wave propagation region 72A is defined as the area along the second electrode termination edge 64, a second slow wave propagation region 72B is defined as the area along the first electrode termination edge 56, and a waveguide region 74 is defined as the area between the first slow wave propagation region 72A and the second slow wave propagation region 72B.

The velocity plot 68 illustrates the desired velocity for wave propagation in each one of the regions. As illustrated, a nominal velocity is desired in the waveguide region 74, a slow velocity is desired in each one of the first slow wave propagation region 72A and the second slow wave propagation region 72B, and a fast velocity is desired in each one of the first fast wave propagation region 70A and the second fast wave propagation region 70B. The wave amplitude plot 66 illustrates the resulting wave, which has a flat amplitude in the waveguide region 74 that decays trigonometrically in the first slow wave propagation region 72A and the second slow wave propagation region 72B and exponentially in the first fast wave propagation region 70A and the second fast wave propagation region 70B. In other words, the wave amplitude plot 66 illustrates an ideal piston wave.

Figure 6:
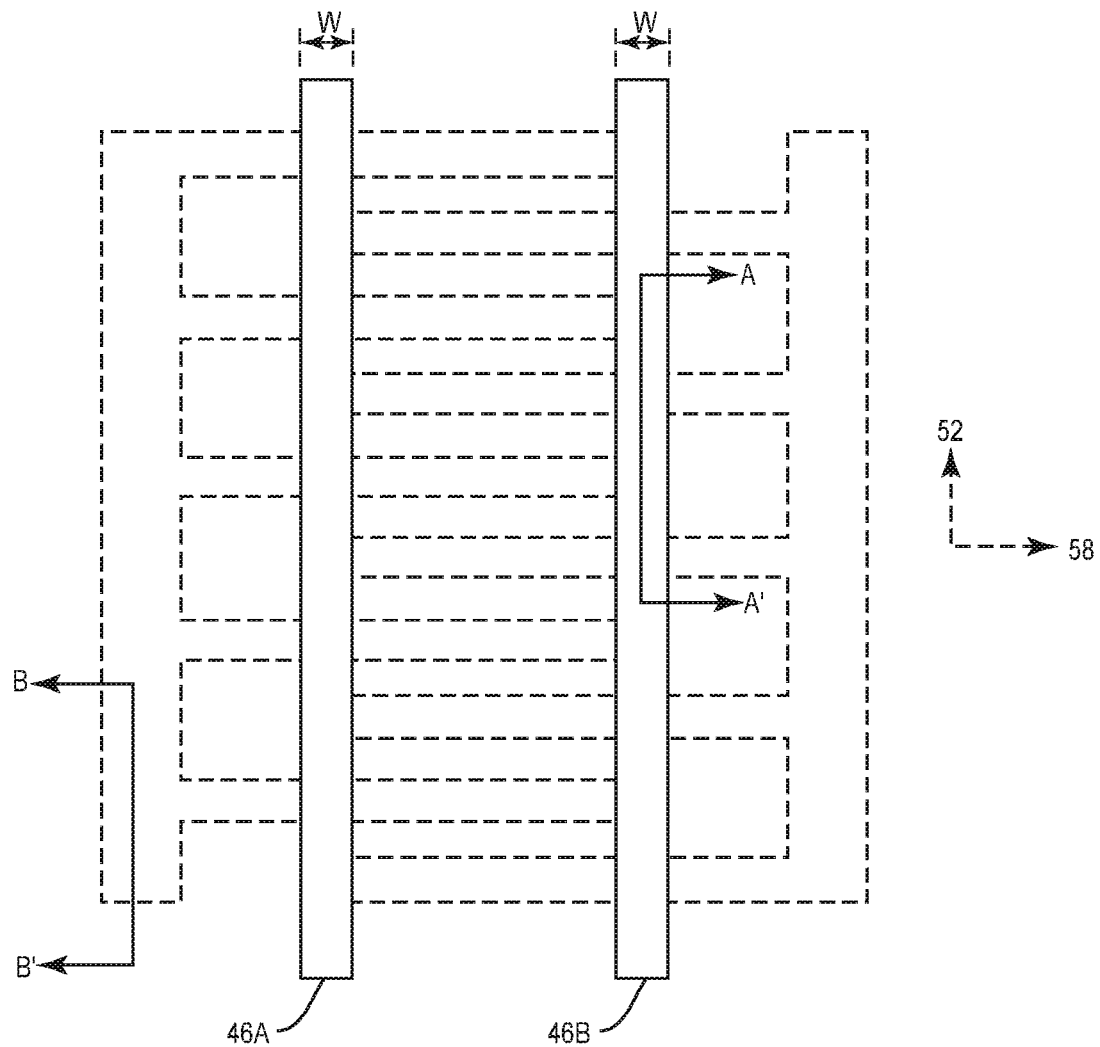
FIG. 6 shows a top view of a temperature compensated acoustic resonator according to one embodiment of the present disclosure.

In addition to providing the interdigital transducer 42 as shown in FIG. 5, the various regions described above may be achieved by the waveguides 46 in the dielectric layer 38 as illustrated in detail in FIG. 6. For example, a first waveguide 46A may be provided over the first slow wave propagation region 72A and a second waveguide 46B may be provided over the second slow wave propagation region 72B. As illustrated, the first waveguide 46A and the second waveguide 46B may be provided as stripes only over those regions. The material of the first waveguide 46A and the second waveguide 46B may ensure the slow propagation of waves in these regions and thus may ensure that the interdigital transducer 42 primarily transduces a piston wave in the piezoelectric layer 36, and specifically in the waveguide region 74. A width W of each one of the waveguides 46 may be equal to the width of the slow wave propagation regions 72 over which they are provided.

Figure 7:
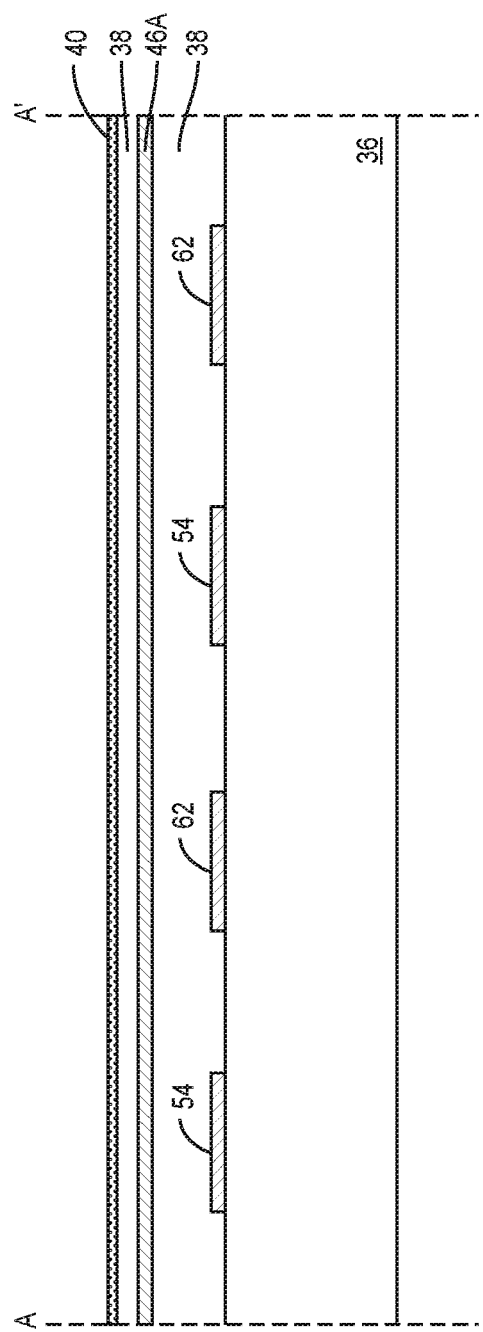
FIG. 7 shows a cross section of a temperature compensated acoustic resonator according to one embodiment of the present disclosure.

FIG. 7 illustrates a cross-section of the temperature compensated acoustic resonator 34 through A-A' shown in FIG. 6. The cross-section includes the piezoelectric layer 36, a first one of the first set of electrode fingers 54, a second one of the first set of electrode fingers 54, a first one of the second set of electrode fingers 62, a second one of the second set of electrode fingers 62 on the piezoelectric layer 36, the dielectric layer 38 over the piezoelectric layer 36, the first one of the first set of electrode fingers 54, the second one of the first set of electrode fingers 54, the first one of the second set of electrode fingers 62, and the second one of the second set of electrode fingers 62, the first waveguide 46A over the dielectric layer 38, and a frequency tuning layer 40 over the first waveguide 46A. The frequency tuning layer 40 is a blanket layer over a surface of the dielectric layer 38 opposite the piezoelectric layer 36. As discussed below, the frequency tuning layer 40 may alter one or more frequency characteristics of the temperature compensated acoustic resonator 34 based on a thickness thereof.

Figure 8:
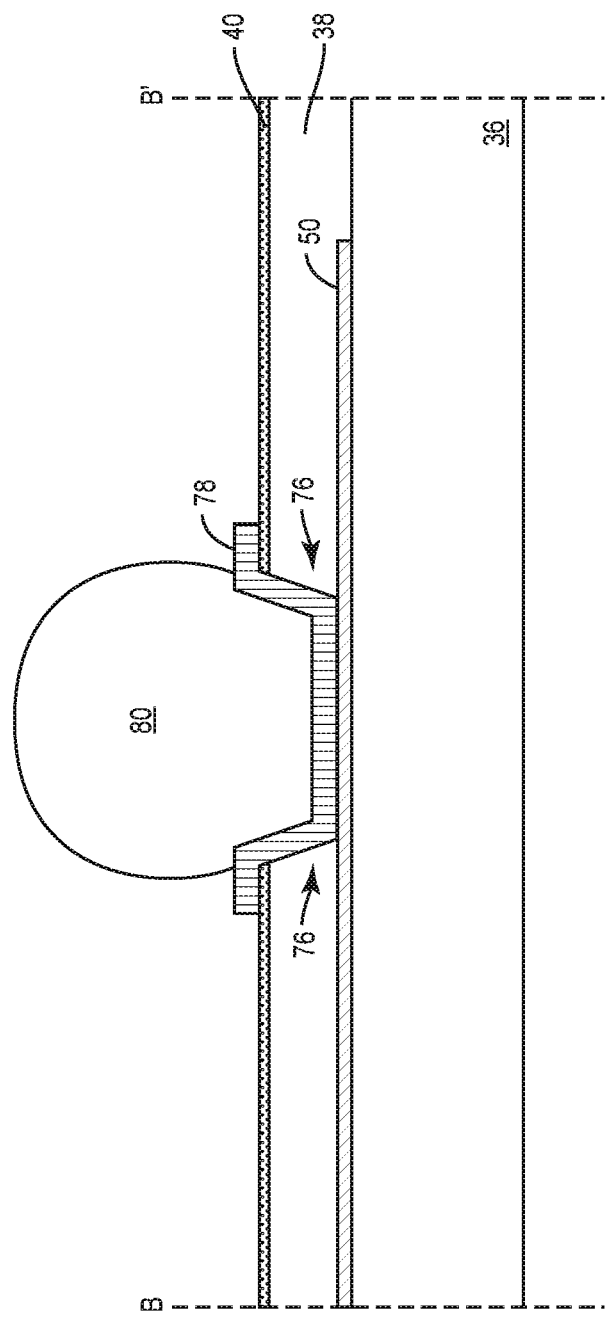
FIG. 8 shows a cross section of a temperature compensated acoustic resonator according to one embodiment of the present disclosure.

FIG. 8 illustrates a cross-section of the temperature compensated acoustic resonator 34 through B-B' shown in FIG. 6. The cross-section includes the piezoelectric layer 36, the first bus bar 50 on the piezoelectric layer 36, the dielectric layer 38 over the piezoelectric layer 36 and the first bus bar 50, the frequency tuning layer 40 over the dielectric layer 38, an opening 76 in the frequency tuning layer 40 and the dielectric layer 38 through which a portion of the first bus bar 50 is exposed, an under bump metal layer 78 over a portion of the frequency tuning layer 40 and in the opening 76 such that the under bump metal layer 78 contacts the first bus bar 50, and a solder ball 80 over the under bump metal layer 78. Those skilled in the art will appreciate that the under bump metal layer 78 is used to provide electrical connections to the interdigital transducer 42 for connection to other devices, and thus may connect the interdigital transducer 42 to other devices located on the piezoelectric layer 36 via one or more conductive traces (not shown) located on the surface of the frequency tuning layer 40.

In various embodiments, the piezoelectric layer 36 may comprise lithium niobate, lithium tantalate, or any other suitable piezoelectric material. Further, the piezoelectric layer 36 may be an offset cut of lithium niobate such as 128° YX cut lithium niobate. The interdigital transducer 42 may comprise multiple metal layers. For example, the interdigital transducer 42 may comprise various combinations of metal layers including titanium/copper/aluminum, titanium/copper-gold/titanium, titanium/aluminum, aluminum only, titanium/aluminum-copper/titanium, or any other suitable metal layer stack. A thickness of the interdigital transducer 42 may be between 265.5 nanometers and 324.5 nanometers. In the case of a titanium/copper/aluminum layer, a thickness of the layer of titanium may be between 13.5 nanometers and 16.5 nanometers, a thickness of the copper layer may be between 225 nanometers and 275 nanometers, and a thickness of the aluminum layer may be between 27 nanometers and 33 nanometers. The dielectric layer 38 may comprise silicon oxide. A thickness of the dielectric layer 38 may be between 972 nanometers and 1188 nanometers. In various embodiments, additional dielectric layers or other functional layers may be provided between the dielectric layer 38 and the piezoelectric layer 36 or on top of the dielectric layer 38 opposite the piezoelectric layer.

The first waveguide 46A and the second waveguide 46B may comprise titanium. A thickness of the first waveguide 46A and the second waveguide 46B may be between 108 nanometers and 132 nanometers. The frequency tuning layer 40 may comprise silicon nitride. A thickness of the frequency tuning layer 40 may be between 72 nanometers and 88 nanometers. The under bump metal layer 78 may comprise a first layer of titanium, a layer of aluminum over the first layer of titanium, and a second layer of titanium over the layer of aluminum. A thickness of the under bump metal layer 78 may be between 1420 nanometers and 1980 nanometers. In particular, a thickness of the first titanium layer may be between 90 nanometers and 110 nanometers, a thickness of the aluminum layer may be between 1350 nanometers and 1650 nanometers, and a thickness of the second titanium layer may be between 180 nanometers and 220 nanometers. Those skilled in the art will appreciate that materials and thicknesses of the various parts of the temperature compensated acoustic resonator 34 discussed above are merely exemplary and the scope of the present disclosure should not be limited thereby.

Figure 9:
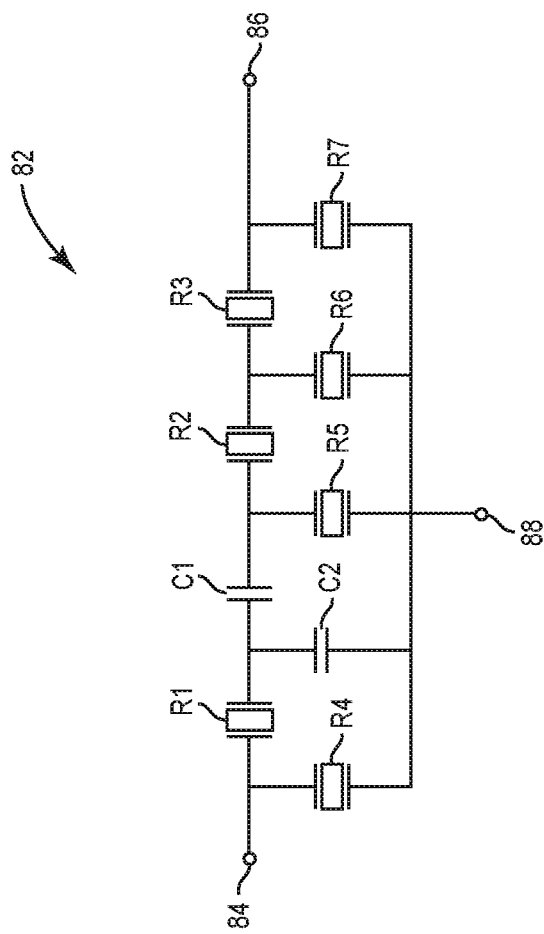
FIG. 9 is a schematic illustrating acoustic filtering circuitry according to one embodiment of the present disclosure.

As discussed briefly above, it may be desirable in some situations to include capacitors along with resonators such as the temperature compensated acoustic resonator 34 discussed above to provide a filter. It is further desirable to incorporate these capacitors onto the same acoustic die as the resonators, and to keep the capacitors as small as possible in order to keep the size of the filter small. FIG. 9 shows an example of such an acoustic filtering circuitry 82 according to one embodiment of the present disclosure. The acoustic filtering circuitry 82 includes a number of resonators R1-R7, a first capacitor C1, and a second capacitor C2 coupled in a ladder network as shown. In particular, a first resonator R1, the first capacitor C1, a second resonator R2, and a third resonator R3 are coupled in series between an input node 84 and an output node 86 to provide a series path. A fourth resonator R4, the second capacitor C2, a fifth resonator R5, a sixth resonator R6, and a seventh resonator R7 are coupled in shunt between various points of the series path and a ground node 88. The resonant frequencies of each one of the resonators R1-R7 are generally slightly different form one another and designed to provide a desired filter response between the input node 84 and the output node 86. The first capacitor C1 and the second capacitor C2 contribute to this filter response as desired. In various embodiments, the resonators R1-R7 along with the first capacitor C1 and the second capacitor C2 may provide a bandpass filter response, a bandpass filter response, or a notch filter response between the input node 84 and the output node 86.

Notably, the first capacitor C1 and the second capacitor C2 are metal-insulator-metal (MIM) capacitors formed without adding additional layers to the acoustic die on which the resonators R1-R7 are provided. That is, the first capacitor C1 and the second capacitor C2 are formed together with the resonators R1-R7 using the same layers required in the formation thereof. The resulting first capacitor C1 and second capacitor C2 are much smaller than those formed by an interdigital transducer and thus allow the size of the acoustic die for the acoustic filtering circuitry 82 to be much smaller than previously achievable. Further, by providing the first capacitor C1 and the second capacitor C2 without additional layers, the cost of adding the first capacitor C1 and the second capacitor C2 to the acoustic filtering circuitry 82 may be minimal. The number of resonators and capacitors in the acoustic filtering circuitry 82 as well as the placement of the first capacitor C1 and the second capacitor C2 shown in FIG. 9 are merely exemplary. Those skilled in the art will readily appreciate that the principles of the present disclosure apply equally to a filter having any number of resonators and capacitors, provided in any number of different configurations.

As discussed in detail below, the first capacitor C1 and the second capacitor C2 may be provided within the layers required for the resonators R1-R7. By providing the first capacitor C1 and the second capacitor C2 in this way, the first capacitor C1 and the second capacitor C2 may occupy less than one tenth the area of each one of the resonators R1-R7, thereby allowing for significant area reductions over conventional filters in which on-die capacitors were provided by an additional interdigital electrode.

Figure 10:
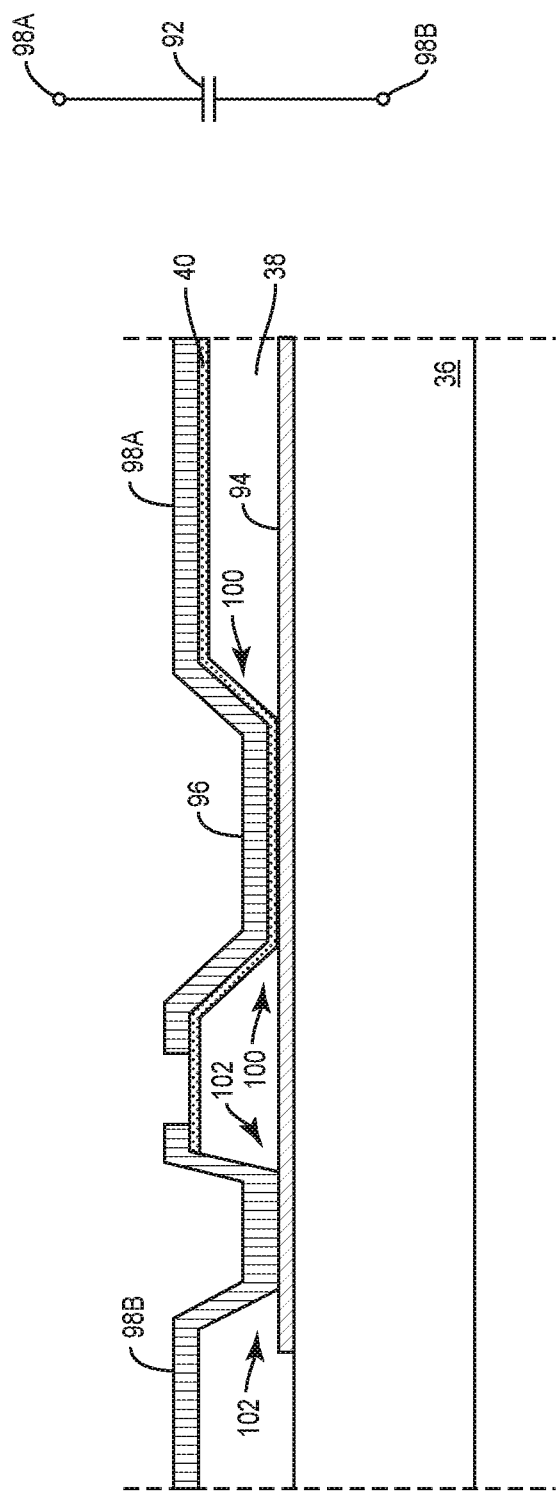
FIG. 10 is a cross section of a metal-insulator-metal (MIM) capacitor according to one embodiment of the present disclosure.

There are various ways to provide a MIM capacitor using the layers required for the resonators R1-R7 discussed herein. Those skilled in the art will appreciate that those presented are merely exemplary and that other configurations may exist for accomplishing the same objectives, all of which are contemplated herein. FIG. 10 shows a MIM capacitor 92 according to one embodiment of the present disclosure. The MIM capacitor 92 includes the piezoelectric layer 36, the dielectric layer 38, the frequency tuning layer 40, a first plate 94, a second plate 96, a first metal trace 98A, and a second metal trace 98B. The first plate 94 is on a surface of the piezoelectric layer 36. The dielectric layer 38 is on the surface of the piezoelectric layer 36 and the first plate 94 and includes a first opening 100 and a second opening 102, through which different portions of the first plate 94 are exposed. The first metal trace 98A is provided on a surface of the dielectric layer 38 opposite the piezoelectric layer 36 and in the first opening 100 such that the first metal trace 98A is in electrical contact with the first plate 94. The first metal trace 98A may extend along the surface of the dielectric layer 38 opposite the piezoelectric layer 36 to connect the first plate 94 to one or more other components, such as an interdigital electrode of one of the resonators R1-R7, an input node, an output node, or a grounding node. The frequency tuning layer 40 is on the surface of the dielectric layer 38 opposite the piezoelectric layer 36 and in the first opening 100. The second plate 96 is on a surface of the frequency tuning layer 40 opposite the first plate 94 in the first opening 100. The second metal trace 98B may be contiguous with the second plate 96 along the surface of the frequency tuning layer 40 opposite the dielectric layer 38. The second metal trace 98B may extend along the surface of the frequency tuning layer 40 opposite the dielectric layer 38 to connect the second plate 96 to one or more other components, such as an interdigital electrode of one of the resonators R1-R7, an input node, an output node, or a grounding node.

The MIM capacitor 92 is thus provided between the first plate 94 and the second plate 96, which are connected to the first metal trace 98A and the second metal trace 98B. A simple schematic view of the MIM capacitor 92 is shown next to the cross-section in FIG. 10. Notably, the first plate 94 is formed from the same layer as the interdigital transducers 42 and reflector structures 44 of the resonators R1-R7 and the second plate 96, the first metal trace 98A, and the second metal trace 98B are formed from the same layer as the under bump metal layer 78. The piezoelectric layer 36, the dielectric layer 38, and the frequency tuning layer 40 are the same as those in the resonators R1-R7. Accordingly, the MIM capacitor 92 may be integrated on the same acoustic die as the resonators R1-R7 without adding layers over those required to create the resonators R1-R7. Further, because the MIM capacitor 92 is vertically disposed in the acoustic die, the area required for the MIM capacitor 92 is significantly less than that required by a capacitor provided by conventional means (e.g., via an additional interdigital transducer), and the MIM capacitor 92 may replace any resonator in a ladder network, rather than just those directly coupled to an input node or an output node.

Figure 11:
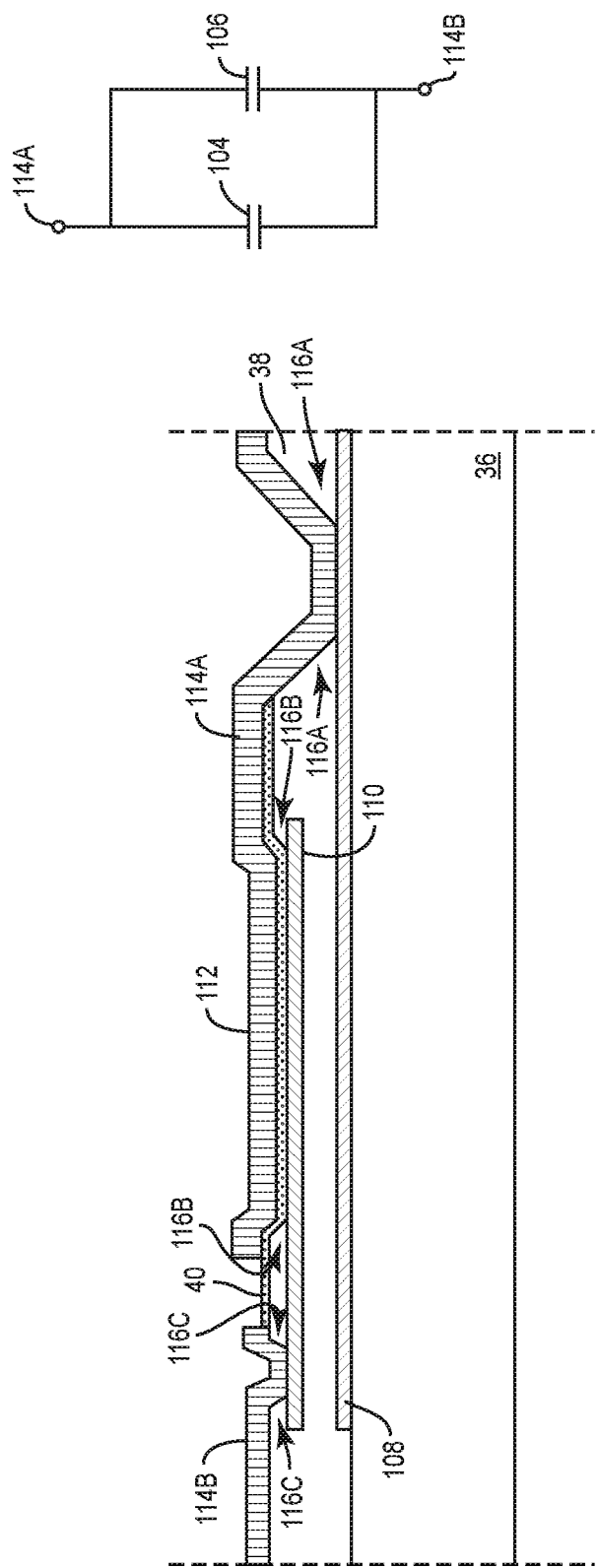
FIG. 11 is a cross section of a MIM capacitor according to one embodiment of the present disclosure.

FIG. 11 shows a first MIM capacitor 104 and a second MIM capacitor 106 according to one embodiment of the present disclosure. The first MIM capacitor 104 and the second MIM capacitor 106 include the piezoelectric layer 36, the dielectric layer 38, the frequency tuning layer 40, a first plate 108, a second plate 110, a third plate 112, a first metal trace 114A, and a second metal trace 114B. The first plate 108 is on a surface of the piezoelectric layer 36. The dielectric layer 38 is on the surface of the piezoelectric layer 36 and the first plate 108. The second plate 110 is embedded in the dielectric layer 38 over at least a portion of the first plate 108 such that a portion of the dielectric layer 38 is between the first plate 108 and the second plate 110. The thickness of the portion of the dielectric layer 38 between the first plate 108 and the second plate 110 may vary in different embodiments, such that the second plate 110 is embedded anywhere between 40% and 80% above the first plate 108 in the dielectric layer 38. The dielectric layer 38 includes a first opening 116A, a second opening 116B, and a third opening 116C. A portion of the first plate 108 is exposed through the first opening 116A, while different portions of the second plate 110 are exposed through the second opening 116B and the third opening 116C. The frequency tuning layer 40 is provided on a surface of the dielectric layer 38 opposite the piezoelectric layer 36 and in the second opening 116B. The third plate 112 is provided on a surface of the frequency tuning layer 40 opposite the second plate 110 in the second opening 116B. The first metal trace 114A is provided on the surface of the dielectric layer 38 opposite the piezoelectric layer 36 and in the first opening 116A such that the first metal trace 114A electrically contacts the first plate 108 and the third plate 112. The first metal trace 114A may be contiguous with the third plate 112 along the surface of the frequency tuning layer 40 opposite the dielectric layer 38. The first metal trace 114A may extend along the surface of the dielectric layer 38 opposite the piezoelectric layer 36 to connect the first plate 108 and the third plate 112 to one or more other components, such as an interdigital electrode of one of the resonators R1-R7, an input node, an output node, or a grounding node. The second metal trace 114B is provided on the surface of the dielectric layer 38 opposite the piezoelectric layer 36 and in the third opening 116C such that the second metal trace 114B electrically contacts the second plate 110. The second metal trace 114B may extend along the surface of the dielectric layer 38 opposite the piezoelectric layer 36 to connect the second plate 110 to one or more other components, such as an interdigital electrode of one of the resonators R1-R7, an input node, an output node, or a grounding node.

The first MIM capacitor 104 is thus provided between the first plate 108 and the second plate 110, while the second MIM capacitor 106 is provided between the second plate 110 and the third plate 112. A simple schematic view of the first MIM capacitor 104 and the second MIM capacitor 106 is shown next to the cross-section in FIG. 11. As shown, the first MIM capacitor 104 and the second MIM capacitor 106 are coupled in parallel between the first metal trace 114A and the second metal trace 114B. Notably, the first plate 108 is formed from the same layer as the interdigital transducers 42 and reflector structures 44 of the resonators R1-R7, the second plate 110 is formed from the same layer as the waveguides 46, and the third plate 112, the first metal trace 114A, and the second metal trace 114B are formed from the same layer as the under bump metal layer 78. The piezoelectric layer 36, the dielectric layer 38, and the frequency tuning layer 40 are the same as those in the resonators R1-R7. Accordingly, the first MIM capacitor 104 and the second MIM capacitor 106 may be integrated on the same acoustic die as the resonators R1-R7 without adding layers over those required to create the resonators R1-R7. Further, because the first MIM capacitor 104 and the second MIM capacitor 106 are vertically disposed in the acoustic die, the area required for the first MIM capacitor 104 and the second MIM capacitor 106 are significantly less than that required by capacitors provided by conventional means (e.g., via an additional interdigital transducer). Further, the first MIM capacitor 104 and the second MIM capacitor 106 may replace any resonator in a ladder network, rather than just those directly coupled to an input node or an output node thereof.

Figure 12:
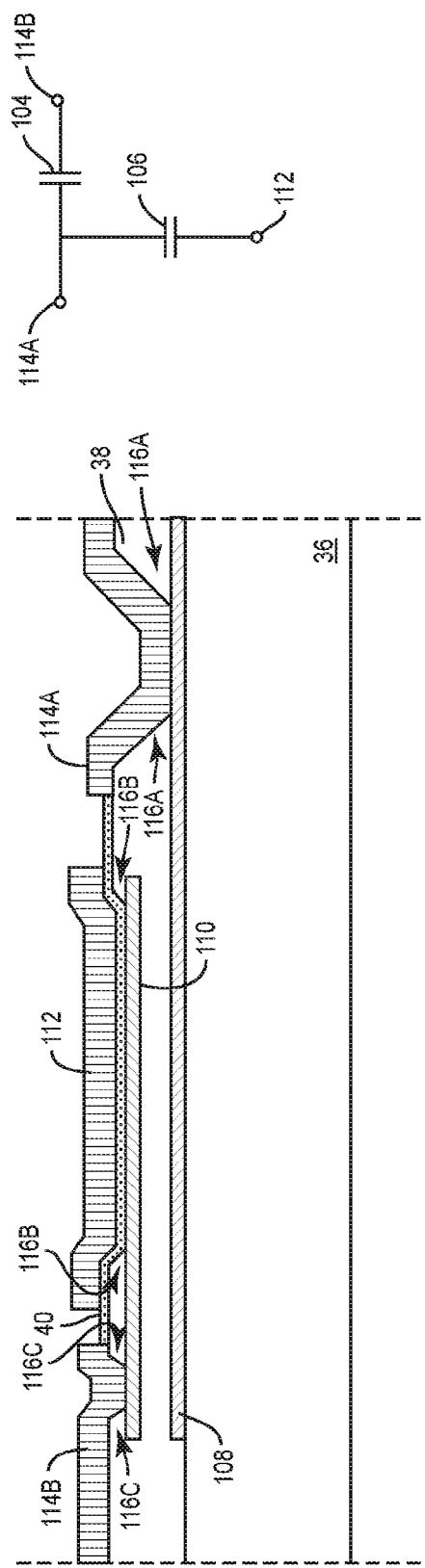
FIG. 12 is a cross section of a MIM capacitor according to one embodiment of the present disclosure.

FIG. 12 shows the first MIM capacitor 104 and the second MIM capacitor 106 according to an additional embodiment of the present disclosure. The first MIM capacitor 104 and the second MIM capacitor 106 shown in FIG. 12 are substantially similar to those shown in FIG. 11, except that the first metal trace 114A is disconnected from the third plate 112. Disconnecting the first metal trace 114A from the third plate 112 allows the first MIM capacitor 104 and the second MIM capacitor 106 to be coupled in a different configuration, as illustrated by the simple schematic adjacent to the cross-section shown in FIG. 12. Rather than being connected between the first metal trace 114A and the second metal trace 114B, the first MIM capacitor 104 is coupled between the first metal trace 114A and the second metal trace 114B while the second MIM capacitor 106 is coupled between the first metal trace 114A and the third plate 112. In such an embodiment, a connection is made directly to the third plate 112 to couple to the first MIM capacitor 104 and the second MIM capacitor 106 as desired.

Figure 13:
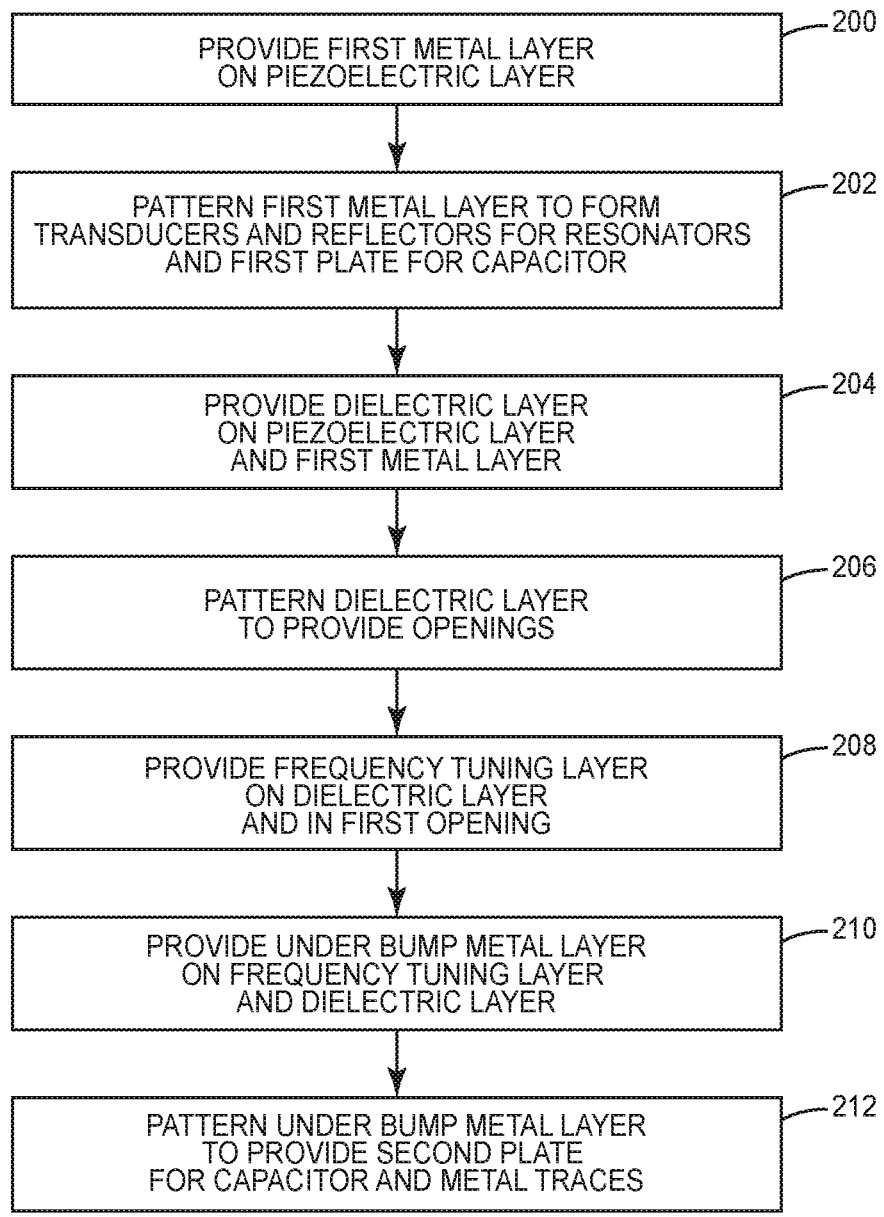
FIG. 13 is a flow diagram illustrating a method for manufacturing acoustic filtering circuitry according to one embodiment of the present disclosure.

FIG. 13 illustrates a method for manufacturing acoustic filtering circuitry including one or more resonators and one or more capacitors according to one embodiment of the present disclosure. Specifically, FIG. 13 illustrates a method for manufacturing acoustic filtering circuitry including the MIM capacitor 92 illustrated in FIG. 10. First, a first metal layer is provided on a surface of a piezoelectric layer (step 200). The first metal layer is then patterned to form a plurality of interdigital transducers, a plurality of reflector structures, and a first plate for a capacitor (step 202). A dielectric layer is then provided over the surface of the piezoelectric layer and the patterned first metal layer (step 204). The dielectric layer is then patterned such that a first opening and a second opening are formed therein to expose different portions of the first plate (step 206). In various embodiments, additional openings may be provided in the dielectric layer to provide access to the electrodes of the interdigital transducers. However, these openings may be made at a different time, such as after a frequency tuning layer has been applied so that the openings may also be formed through the frequency tuning layer. Further, a first portion of the dielectric layer may be applied, a second metal layer may be provided over the first portion of the dielectric layer and patterned to form waveguides over the interdigital transducers as shown above, and a second portion of the dielectric layer may be provided over the first portion of the dielectric layer and the plurality of waveguides.

A frequency tuning layer is then provided over a surface of the dielectric layer opposite the piezoelectric layer and in the first opening (step 208). The frequency tuning layer may be selectively applied or patterned after application such that the frequency tuning layer is not provided in the second opening and over select portions of the surface of the dielectric layer opposite the piezoelectric layer. The frequency tuning layer may be ground or otherwise reduced in thickness to achieve a desired frequency response of the acoustic filtering circuitry. Specifically, a frequency response of the acoustic filtering circuitry may be measured and a thickness of the frequency tuning layer may be adjusted based on the measured response to produce a desired frequency response thereof.

An under bump metal layer is then provided over the frequency tuning layer and any exposed portions of the dielectric layer (step 210). Specifically, the under bump metal layer is provided in the first opening and the second opening such that the under bump metal layer forms a second plate over the first plate in the first opening and electrically contacts the first plate in the second opening. The under bump metal layer is then patterned to provide the second plate, a first metal trace coupled to the second plate, and a second metal trace coupled to the first plate (step 212). In various embodiments, the under bump metal layer may be patterned such that it provides contact to the electrodes of the interdigital transducers through the openings in the dielectric layer and the frequency tuning layer. Further, one or more solder balls may be provided on the under bump metal layer in order to couple the acoustic filtering circuitry to additional circuitry.

By providing acoustic filtering circuitry in this manner, one or more capacitors may be integrated along with one or more resonators on the same acoustic die without the addition of any layers. While one or more additional masking steps may be required to provide the various parts of the capacitors as discussed above, these additional steps add minimal complexity to the manufacturing process. Further, using the above process provides capacitors that are substantially smaller than those provided by conventional means (e.g., by the addition of one or more interdigital transducers). Accordingly, the size of the resulting acoustic filtering circuitry may be significantly reduced.

Figure 14:
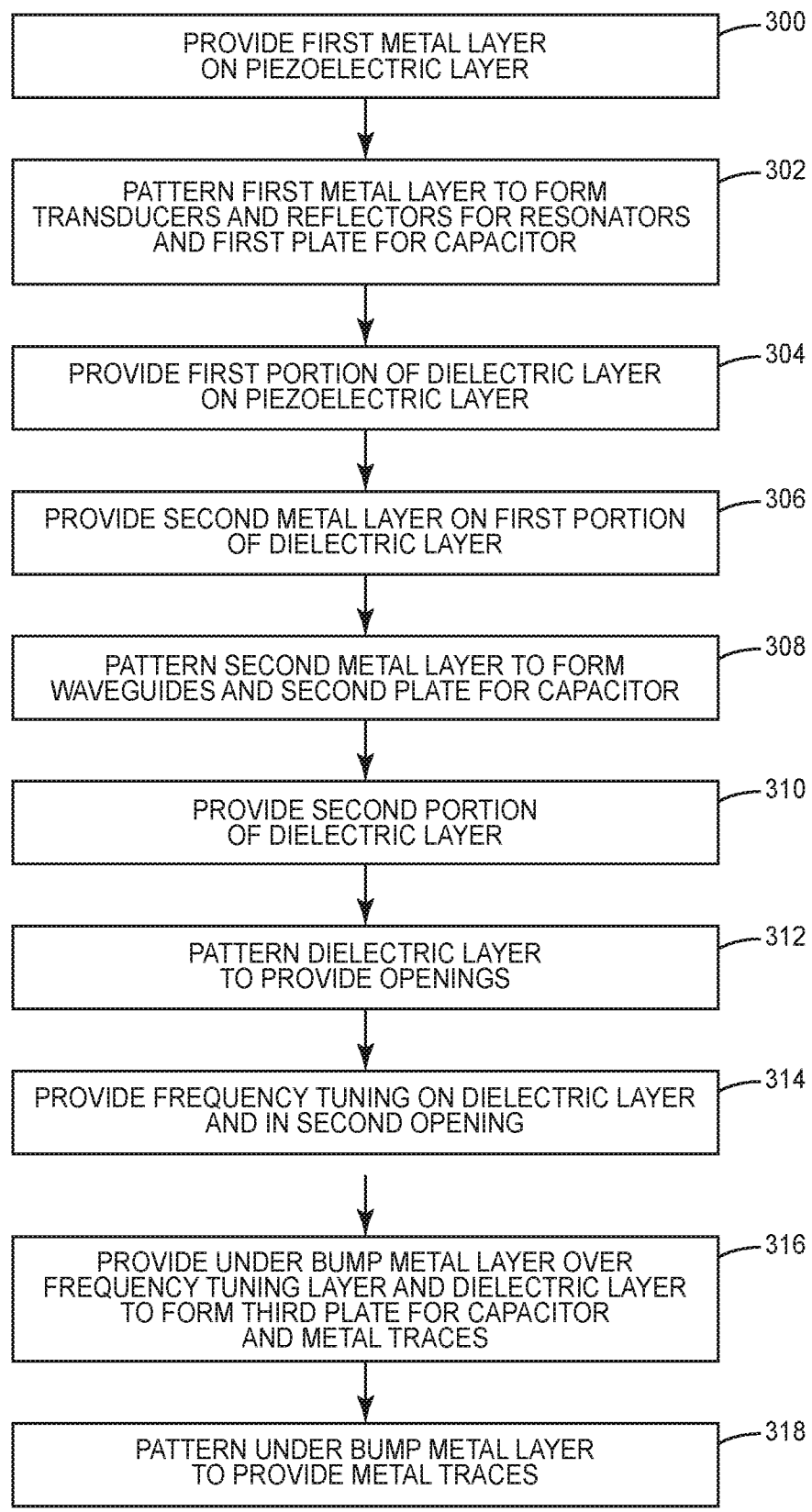
FIG. 14 is a flow diagram illustrating a method for manufacturing acoustic filtering circuitry according to one embodiment of the present disclosure.

FIG. 14 illustrates a method for manufacturing acoustic filtering circuitry including one or more resonators and one or more capacitors according to an additional embodiment of the present disclosure. Specifically, FIG. 14 illustrates a method for manufacturing acoustic filtering circuitry including the first MIM capacitor 104 and the second MIM capacitor 106 illustrated in FIGS. 12 and 13. First, a first metal layer is provided on a surface of the piezoelectric layer (step 300). The first metal layer is then patterned to form a plurality of interdigital transducers, a plurality of reflector structures, and a first plate for a capacitor (step 302). A first portion of a dielectric layer is then provided over the surface of the piezoelectric layer and the patterned first metal layer (step 304). A second metal layer is then provided over the first portion of the dielectric layer (step 306). The second metal layer is then patterned to form a plurality of waveguides over the plurality of interdigital transducers and a second plate for a capacitor (step 308). A second portion of the dielectric layer is then provided over the first portion and the under bump metal layer (step 310). The second portion of the dielectric layer is then patterned such that a first opening, a second opening, and a third opening are formed therein (step 312), wherein a portion of the first plate is exposed through the first opening and different portions of the second plate are exposed through the second opening. In various embodiments, additional openings may be provided in the dielectric layer to provide access to the electrodes of the interdigital transducers. However, these openings may be made at a different time, such as after a frequency tuning layer has been applied so that the openings may also be formed through the frequency tuning layer. A frequency tuning layer is then provided over a surface of the dielectric layer opposite the piezoelectric layer (step 314). The frequency tuning layer may be selectively applied or patterned after application such that the frequency tuning layer is not provided in the first opening or the third opening and over select portions of the dielectric layer opposite the piezoelectric layer. The frequency tuning layer may be ground or otherwise reduced in thickness to achieve a desired frequency response of the acoustic filtering circuitry. Specifically, a frequency response of the acoustic filtering circuitry may be measured and a thickness of the frequency tuning layer may be adjusted based on the measured response to produce a desired frequency response thereof.

An under bump metal layer is then provided over the frequency tuning layer and any exposed portions of the dielectric layer (step 316). Specifically, the under bump metal layer is provided in the first opening such that the under bump metal layer contacts the first plate, in the second opening such that the under bump metal layer forms a third plate over the second plate, and in the third opening such that the under bump metal layer contacts the second plate. The under bump metal layer is then patterned to provide a first metal trace coupled to the first plate and the third plate and a second metal trace coupled to the second plate (step 318). In some embodiments, the under bump metal layer is patterned such that the first metal trace does not contact the third plate as in FIG. 12.

By providing acoustic filtering circuitry in this manner, one or more capacitors may be integrated along with one or more resonators on the same acoustic die without the addition of any layers. While one or more additional masking steps may be required to provide the various parts of the capacitors as discussed above, these additional steps add minimal complexity to the manufacturing process. Further, using the above process provides capacitors that are substantially smaller than those provided by conventional means (e.g., by the addition of one or more interdigital transducers). Accordingly, the size of the resulting acoustic filtering circuitry may be significantly reduced.

Those skilled in the art will recognize improvements and modifications to the preferred embodiments of the present disclosure. All such improvements and modifications are considered within the scope of the concepts disclosed herein and the claims that follow.

What is claimed is:

1. Acoustic filtering circuitry comprising:
   an input node, an output node, and a ground node;
   a piezoelectric layer;
   a dielectric layer over a surface of the piezoelectric layer;
   a plurality of acoustic resonators each comprising a transducer on the surface of the piezoelectric layer such that the transducer is between a portion of the piezoelectric layer and the dielectric layer;
   a capacitor comprising:
      a first plate on the surface of the piezoelectric layer such that the first plate is between a portion of the piezoelectric layer and the dielectric layer; and
      a second plate over the first plate such that the second plate and the first plate are separated by at least a portion of the dielectric layer; and
   a plurality of metal traces over a surface of the dielectric layer, wherein the plurality of metal traces electrically couple the plurality of acoustic resonators and the capacitor between the input node, the output node, and the ground node such that:
      a first set of the plurality of acoustic resonators is coupled in series between the input node and the output node to form a series signal path;
      a second set of the plurality of acoustic resonators is coupled in parallel between the series signal path and the ground node to form a plurality of shunt signal paths; and
      the capacitor is coupled in the series signal path such that the capacitor is coupled in series with the first set of the plurality of acoustic resonators, at least one of the first set of the plurality of acoustic resonators is coupled between the capacitor and the input node, and at least one of the first set of the plurality of acoustic resonators is coupled between the capacitor and the output node.

2. The acoustic filtering circuitry of claim 1 wherein:
   the piezoelectric layer comprises one of lithium niobate and lithium tantalate;
   the dielectric layer comprises silicon oxide;
   the first plate comprises multiple metal layers; and
   the second plate comprises titanium.

3. The acoustic filtering circuitry of claim 1 wherein the plurality of metal traces electrically couple the plurality of acoustic resonators and the capacitor in a ladder network between the input node and the output node.

4. The acoustic filtering circuitry of claim 3 wherein the capacitor is coupled in series between the input node and the output node.

5. The acoustic filtering circuitry of claim 3 wherein the capacitor is coupled in shunt between the input node and the output node.

6. The acoustic filtering circuitry of claim 1 further comprising:
   a frequency tuning layer over the surface of the dielectric layer opposite the piezoelectric layer such that the frequency tuning layer is between the surface of the dielectric layer and the plurality of metal traces; and
   an additional capacitor comprising a third plate over the second plate such that the third plate and the second plate are separated by at least a portion of the frequency tuning layer.

7. The acoustic filtering circuitry of claim 6 wherein the plurality of metal traces couple the plurality of acoustic resonators, the capacitor, and the additional capacitor between the input node and the output node such that the additional capacitor is separated from the input node and the output node by at least one of the plurality of acoustic resonators.

8. The acoustic filtering circuitry of claim 7 wherein the plurality of metal traces electrically couple the plurality of acoustic resonators, the capacitor, and the additional capacitor in a ladder network between the input node and the output node.

9. The acoustic filtering circuitry of claim 6 further comprising a plurality of waveguides, each over a transducer of a different one of the plurality of acoustic resonators on the surface of the dielectric layer such that each one of the plurality of waveguides is between the dielectric layer and the frequency tuning layer and configured such that a piston wave is transduced in the piezoelectric layer by each one of the transducers in response to an alternating electrical current.

10. The acoustic filtering circuitry of claim 9 wherein:
    the piezoelectric layer comprises one of lithium niobate and lithium tantalate;
    the dielectric layer comprises silicon oxide;
    the frequency tuning layer comprises silicon nitride;
    the first plate comprises multiple metal layers;
    the second plate and each of the plurality of waveguides comprise titanium; and
    the frequency tuning layer comprises silicon nitride.

11. A method for manufacturing acoustic filtering circuitry comprising:
    providing a piezoelectric layer;
    providing a first metal layer on a surface of the piezoelectric layer;
    patterning the first metal layer to provide a plurality of transducers and a first plate;
    providing a dielectric layer over the surface of the piezoelectric layer and the first metal layer;
    providing a second metal layer on a surface of the dielectric layer opposite the piezoelectric layer; and patterning the second metal layer to provide a waveguide over each of the transducers and a second plate over the first plate such that the second plate and the first plate are separated by at least a portion of the dielectric layer to form a capacitor.

12. The method of claim 11 wherein:
the piezoelectric layer comprises one of lithium niobate and lithium tantalate;
the first metal layer comprises multiple metal layers;
the dielectric layer comprises silicon oxide; and
the second metal layer comprises titanium.

13. The method of claim 11 wherein the waveguide over each of the plurality of transducers is configured such that a piston wave is transduced in the piezoelectric layer by each of the transducers in response to an alternating electrical signal.

14. The method of claim 11 further comprising providing a frequency tuning layer over the surface of the dielectric layer and the second metal layer.

15. The method of claim 14 further comprising patterning the frequency tuning layer and the dielectric layer to expose one or more portions of the first metal layer and the second metal layer.

16. The method of claim 15 further comprising:
providing an under bump metal layer over a surface of the frequency tuning layer opposite the dielectric layer and the exposed portions of the first metal layer; and
patterning the under bump metal layer to provide:
  a third plate over the second plate such that the third plate and the second plate are separated by at least a portion of the frequency tuning layer to form an additional capacitor; and
  a plurality of metal traces electrically coupling the plurality of transducers, the first plate, the second plate, and the third plate between an input node and an output node to provide a desired filter response.

17. The method of claim 16 wherein:
each one of the plurality of transducers provides an acoustic resonator such that a plurality of acoustic resonators is provided;
the first plate and the second plate provide the capacitor; and
the second plate and the third plate provide the additional capacitor.

18. The method of claim 17 wherein the plurality of metal traces electrically couple the plurality of acoustic resonators, the capacitor, and the additional capacitor in a ladder network between the input node and the output node.

19. The method of claim 16 wherein:
the piezoelectric layer comprises one of lithium niobate and lithium tantalate;
the first metal layer comprises multiple metal layers;
the dielectric layer comprises silicon oxide; and
the second metal layer comprises titanium;
the frequency tuning layer comprises silicon nitride; and
the under bump metal layer comprises a first layer of titanium, a layer of aluminum over the first layer of titanium, and a second layer of titanium over the layer of aluminum.

20. Acoustic filtering circuitry comprising:
an input node, an output node, and a ground node;
a piezoelectric layer;
a dielectric layer over a surface of the piezoelectric layer;
a plurality of acoustic resonators each comprising a transducer on the surface of the piezoelectric layer such that the transducer is between a portion of the piezoelectric layer and the dielectric layer;
a capacitor comprising:
  a first plate on the surface of the piezoelectric layer such that the first plate is between a portion of the piezoelectric layer and the dielectric layer; and
  a second plate over the first plate such that the second plate and the first plate are separated by at least a portion of the dielectric layer; and
a plurality of metal traces over a surface of the dielectric layer, wherein the plurality of metal traces electrically couple the plurality of acoustic resonators and the capacitor between the input node, the output node, and the ground node such that:
  a first set of the plurality of acoustic resonators is coupled in series between the input node and the output node to form a series signal path;
  a second set of the plurality of acoustic resonators is coupled in parallel between the series signal path and the ground node to form a plurality of shunt signal paths; and
  the capacitor is directly coupled between the series signal path and the ground node.

* * * * *